United States Patent [19]

Welland

[11] 4,409,500

[45] Oct. 11, 1983

[54] OPERATIONAL RECTIFIER AND BIAS GENERATOR

[75] Inventor: David R. Welland, Boston, Mass.

[73] Assignee: DBX, Inc., Newton, Mass.

[21] Appl. No.: 247,811

[22] Filed: Mar. 26, 1981

[51] Int. Cl.³ .................. H03K 17/00; G06G 7/12
[52] U.S. Cl. ................ 307/490; 307/261; 307/491; 328/26
[58] Field of Search ......... 307/261, 310, 491, 297, 307/493, 494; 328/28, 145

[56] References Cited

U.S. PATENT DOCUMENTS

| | | | |
|---|---|---|---|
| 3,329,836 | 4/1967 | Pearlman et al. | 307/491 |
| 3,660,768 | 5/1972 | Dammann et al. | 307/493 |
| 4,004,161 | 1/1977 | Ryder | 307/261 |
| 4,097,767 | 6/1978 | Blackmer et al. | 328/26 |
| 4,329,598 | 5/1982 | Welland | 307/310 |
| 4,350,904 | 9/1982 | Cordell | 307/310 |

Primary Examiner—Stanley D. Miller
Assistant Examiner—B. P. Davis
Attorney, Agent, or Firm—Schiller & Pandiscio

[57] ABSTRACT

An improved current mode operational rectifier having loop transmissions through both feedback paths of an operational amplifier stage which limit at unity gain. An improved bias generator which can be used to bias the operational rectifier is also disclosed.

23 Claims, 5 Drawing Figures

OPERATIONAL RECTIFIER AND BIAS GENERATOR

The present invention relates generally to rectification circuits and bias generators for use with such circuits, and more particularly, to an improved current mode operational rectifier having loop transmission limits and an improved bias generator for biasing such rectifiers.

A current mode operational rectifier is shown and described in U.S. Pat. No. 4,097,767. As described in the patent the rectifier (1) may be easily manufactured in accordance with integrated circuit techniques since it can employ only NPN transistors, (2) does not require matched resistances or accurate resistance ratios, (3) employs only one operational amplifier and therefore no matching of amplifiers or trimming is required; (4) is not affected by any offset voltages which may exist between the input terminals of the operational amplifier when the rectifier is used for AC signal rectification, (5) provides in its preferred form broadband rectification in the microampere to milliampere range, (6) operates with relatively relaxed slew rate requirements of the operational amplifier stage.

The rectifier generally includes an operational amplifier stage having its negative input terminal adapted to receive the input information signal, and its positive input terminal connected to system ground. The output of the stage is coupled to the base of an NPN transistor, with the emitter of the transistor coupled to the negative input of the stage and the collector coupled to the output terminal of the rectifier. This forms a first feedback conduction path for one representation or polarity (i.e. negative polarity) of the input signal. The input terminal of the stage is also coupled to the collector of a second NPN transistor having its emitter coupled to the output of the amplifier stage and its base connected to system ground. The collector-emitter path of the second transistor conducts as a second feedback current around the stage when the other representation or polarity (i.e., positive polarity) of the input signal is applied to the input terminal of the stage. A third NPN transistor has its collector coupled to the output of the device and its emitter coupled to both the emitter of the second transistor and to the output terminal of the amplifier stage. As described in U.S. Pat. No. 4,097,767, the base of the third transistor can be connected to system ground. The collector-emitter path of the third transistor conducts a current in response to current conducted through the second transistor. The current through the third transistor is a mirrored current substantially equal and opposite to the current conducted through the second transistor. Due to the slightly different gain factors provided by transistors, the output currents provided in response to two equal input signals to the rectifier of opposite polarity will not be exactly the same. Accordingly, as taught by U.S. Pat. No. 4,097,767, gain symmetry can be provided and the error substantially eliminated by suitably biasing the base of the third transistor.

While this rectification circuit has proven to be of substantial value, the loop transmission through the second transistor will increase without limit with increasing current. While the stability problems associated with the latter condition are not insolvable, the most obvious solution is slower circuit performance (resulting in limited bandwidth).

Accordingly, an object of the present invention is to provide an improved current mode operational rectifier of the type described in U.S. Pat. No. 4,097,767.

Another object of the present invention is to limit the loop transmission of the current mode operational rectifier of the type described in U.S. Pat. No. 4,097,767 for both polarities of the input signal.

And another object of the present invention is to provide an improved current mode operational rectifier eliminating stability problems associated with unlimited loop transmission in the rectification of positive input signals by the rectifier disclosed in U.S. Pat. No. 4,097,767.

These and other objects are achieved by an improved operational rectifier of the type described in U.S. Pat. No. 4,097,767, in which transmission through each conduction path limits at unity gain.

With respect to another aspect of the present invention, as described in U.S. Pat. No. 4,097,767, a bias voltage can be used to induce a biasing current (Icirc) through the base-emitter path of the first transistor and the collector-emitter path of the second transistor so as to reduce the slew rate requirements of the operational amplifier stage. Icirc however produces a current error (Icirc error) at the output of the circuit due to the induced current in the collector of the first transistor and the induced current in the collector-emitter path of the third transistor in response to Icirc.

As described in my copening application U.S. Ser. No. 137,427 filed on Apr. 4, 1980, now U.S. Pat. No. 4,329,598 issued May 11, 1982, while increasing the bias voltage level with the bias generator of the type described in U.S. Pat. No. 4,097,767 decreases the slew rate and gain bandwidth requirements of the amplifier stage for a given performance of the circuit, Icirc error will also increase. The maximum level of Icirc error occurs near the cross-over region and as such the Icirc error at the output terminal must be five to ten times smaller than the smallest signal for which accurate rectification is desired. Accordingly, the biasing level is selected so that the maximum Icirc error is achieved and not exceeded in the cross over region. A problem with using the bias generator of U.S. Pat. No. 4,097,767 is that the bias voltage is such that the Icirc error will vary with temperature, creating the possibility that the maximum Icirc error may be exceeded when changes in ambient temperature occur.

The bias generator shown in my U.S. Pat. No. 4,329,598 solves the problem by (1) matching the changes in the bias voltage as a function of temperature with that of the changes in the current and temperature dependent voltage drops provided by the base-emitter junctions of first and second transistors (referred to in my U.S. Pat. No. 4,329,598 as matching the coefficient of temperature of the bias generator with the coefficient of temperature of the load) and (2) making Icirc and thus Icirc error independent of temperature.

Implementing the bias generator of the type disclosed in my U.S. Pat. No. 4,329,598 into an integrated circuit form, however, poses certain problems. Various capacitances to system ground (most importantly, the parasitic capacitance between the collector of each transistor and the substrate) are provided when connecting the generator between the base of the first transistor and the common emitters of the second and third transistors. These capacitances affect the loop transmissions of both the inverting and noninverting paths of the rectifier. The burden that the generator imposes on the loop transmissions of the rectifier circuit demands that the amplifier stage be slowed down considerably (in terms of its bandwidth) to ensure stability.

It is therefore another object of the present invention to provide an improved bias generator of the type described in the Copending Application.

Yet another object of the present invention is to provide an improved biasing scheme for biasing the current mode operational rectifier which reduces the slew requirements of the rectifier for a given performance level.

Still another object of the present invention is to provide an improved biasing scheme for biasing the current mode operational rectifier of the type described in U.S. Pat. No. 4,097,767 in which rectification errors due to the finite slew rate of amplifier stage can be greatly reduced.

And yet another object of the present invention is to provide an improved bias generator of the type described in my U.S. Pat. No. 4,329,598 for use in biasing a current mode operational rectifier and which can be easily implemented in IC form.

These and other objects of the present invention are achieved by a bias generator which is an improvement over the type described in my U.S. Pat. No. 4,329,598 particularly where used with the operational rectifier of the present invention. The improved generator includes means for generating the bias voltage in a similar manner as that described in my U.S. Pat. No. 4,329,598. The biasing voltage is applied across a first impedance load including first resistive means. The first resistive means is coupled to second resistive means of a second impedance load such that current generated in said first resistive means in response to said bias voltage results in a current being generated in the second resistive means, which in turn results in the bias voltage being generated across the second impedance load. By coupling the second impedance load between the base of the first transistor and the common emitters of the second and third transistors of the previously described operational rectifier, the means for generating the bias voltage (as well as establishing Icirc as independent of temperature) can be connected to AC ground of the rectifier providing substantial improvements.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims.

For a fuller understanding of the nature and objects of the present invention, reference should be had to the following detailed description taken in connection with the acompanying drawings wherein.

Like numerals and letters are used in the figures to designate like parts.

Figure 1:
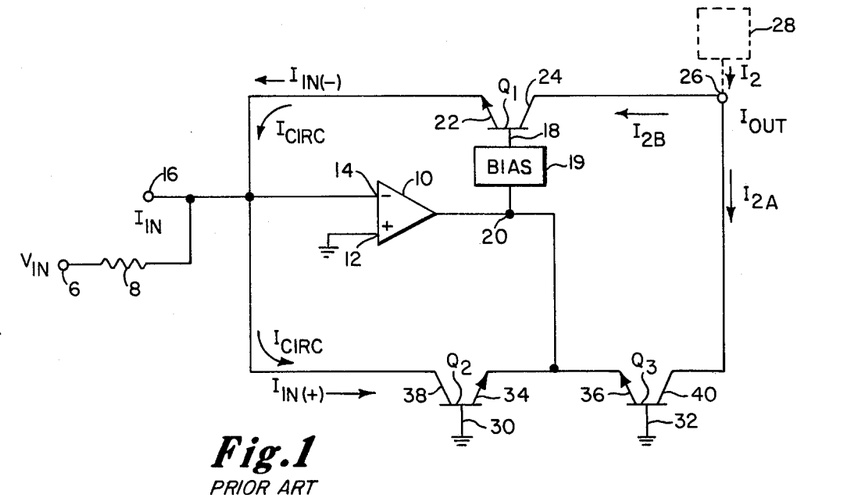
FIG. 1 shows a circuit diagram of an operational rectifier of the type described in U.S. Pat. No. 4,097,767.

As shown in FIG. 1, the operational rectification circuit of the type described in U.S. Pat. No. 4,097,767 includes a high gain inverting amplifier 10. Amplifier 10 has its non-inverting input terminal 12 connected to system ground and its inverting input terminal 14 connected to input terminal 16 of the device for receiving AC current input signal Iin. Current input terminal 16 is connected through resistor 8 to voltage input terminal 6. Amplifier 10 is used as the amplifier stage in an operational amplifier configuration.

A first transmission path is provided by transistor Q1 which in the illustrated embodiment is a NPN type transistor having its base 18 coupled through the bias generator 19 to output terminal 20 of amplifier 10, its emitter 22 coupled directly to input terminal 16 of the device and its collector 24 coupled to output terminal 26 of the device. Means are provided for coupling output terminal 26 to an operational amplifier virtual ground shown schematically at 28 set at a predetermined DC voltage level with respect to system ground so that current I2 is provided as shown. The DC voltage level is a positive value near ground. For example, one value of voltage level for virtual ground 28 found to be satisfactory is +0.5 DC volts relative to system ground. Transistor Q1 is preferably a high gain transistor. For example, a gain of 100 is satisfactory although higher gains can be achieved using current IC techniques.

A second transmission path is provided by the transistors Q2 and Q3 each illustrated as NPN transistors having their respecive bases 30 and 32 connected to system ground and their emitters 34 and 36 tied together to the output terminal 20 of amplifier 10. Collector 38 of transistor Q2 is connected to inverting input terminal 14 of amplifier 10. Collector 40 of transistor Q3 is connected to the output terminal 26. Preferably, transistors Q2 and Q3 are well matched for current gain, Vbe/Ic characteristics, etc., so that maintaining the two transistors at the same base-to-emitter voltage will provide equal collector currents.

In operation, when Iin is of a positive polarity, the output of amplifier 10 is a negative voltage. With the base of transistor Q2 then being positive with respect to its emitter, transistor Q2 conducts current Iin(+) from inverting input terminal 14 of amplifier 10 to output terminal 20 of the amplifier. Since the emitter of transistor Q2 is connected to the emitter of transistor Q3 and since their bases are also tied together (to ground), the base 32 of transistor Q3 is positive with respect to emitter 36 so that transistor Q3 also conducts a current I2A. Since transistors Q2 and Q3 are matched and are always at the same base-to-emitter voltage, the instantaneous level of Iin(+) equals the instantaneous level of I2A. Thus, I2A is the mirrored current signal of Iin(+). Neglecting the base currents of transistors Q2 and Q3, the instantaneous level of the current flowing to the output of amplifier 10 will be equal to the sum of the instantaneous values of Iin(+) and I2A.

Since the instantaneous level of Iin(+) equals the instantaneous level of I2A, the output current at output terminal 26 follows the input current when the latter is of a positive polarity. During this period, since the output signal of amplifier 10 applied to the base of transistor Q1 is negative, transistor Q1 will not conduct.

When the AC input current Iin is of a negative polarity, amplifier 10 provides a positive output voltage. Emitter 34 of transistor Q2 is then positive with respect to its base 30 and emitter 36 of transistor Q3 is positive with respect to its base 32 so that neither transistor Q2 nor Q3 will conduct. However, base 24 of transistor Q1 is positive with respect to its emitter 22 so that a collector-emitter current will flow through transistor Q1. This current flow is such that the emitter current Iin(−), flowing from the emitter of transistor Q1 to inverting input terminal 14 will be equal to the base current Ib flowing from output terminal 20 of amplifier 10 to the base of the transistor Q1 plus the collector current 12B flowing from virtual ground 28. The value of the base current Ib is dependent on the gain of transistor Q1, and by choosing a high gain transistor for transistor Q1, the error introduced by Ib will be negligible. For example, for a gain of 100, Ib will be approximately 1% of Iin(−), or I2B will be 99% of Iin(−). Thus, for the example given, the instantaneous level of the output current appearing at terminal 26 will be substantially equal to the instantaneous level of the input current Iin when the latter is positive, and approximately 99% of the instantaneous level of the input current Iin (and of opposite polarity when the input current is negative). As described in U.S. Pat. No. 4,097,767 the gain error introduced by Ib can be corrected if desired by properly adjusting the base voltage bias on transistors Q2 and Q3.

Without the biasing signal generator 19, i.e., connecting base 18 of transistor Q1 directly to output terminal 20 of amplifier 10, the slew rate of amplifier 10 determines the amount of time that occurs when one transmission path stops conducting and the other transmission path starts conducting in response to a change in polarity in the input signal Iin. The slew rate may be of little significance when the input signal Iin swings between relatively large positive and negative levels or when the input signal Iin is slowly varying. However, where the input signal Iin is of a relatively small magnitude and at relatively high frequencies, the amount of time required for the output signal at terminal 20 of amplifier 10 to swing from a sufficient magnitude at one polarity so that one transmission path conducts to a sufficient magnitude at the other polarity so that the other transmission path conducts, can become significant since information contained in the input signal during this time is lost.

Accordingly, the bias generator 19 is provided between the output terminal 20 of amplifier 10 and the base 18 of transistor Q1 in order to reduce the slew rate requirements. The biasing voltage produces a circulating current, Icirc, through the base-emitter path of transistor Q1 which will be transmitted through the collector-emitter path of transistor Q2. This results in a circulating current Icirc which has no effect on the value of the signal applied to the input of the device at terminal 16, but produces a current error at the output terminal 26 of the circuit which is twice the magnitude of Icirc. Thus, the bias generator 19 provides a tradeoff. By providing a cross-over bias voltage, the amplifier needs to slew through a smaller range of voltages, permitting better high frequency operation. However, inducing the circulating current Icirc also results in the inducement of an error signal at the output terminal 26 of the circuit. Increasing the biasing voltage level provided by generator 19, decreases the slew rate and gain bandwidth requirements of amplifier 10 for a given performance of the circuit, but also increases the error signal at terminal 26 that is caused by Icirc.

It is therefore desirable to increase the bias potential provided by generator 19 to the point where the Icirc error at terminal 26 is at its maximum acceptable level. This level must be five to ten times smaller than the smallest signal for which accurate rectification is desired. As the output current increases the Icirc error will decrease. Thus, the Icirc error is of concern at small signal levels.

Using bias generators of the type described in U.S. Pat. No. 4,097,767 can, however, provide problems. Changes in ambient temperature can effect the generator 19 so that the biasing potential is changed so as to change the Icirc error at terminal 26. Changes in temperature can therefore cause undesirable changes in the Icirc error to the point where Icirc may become as large or larger than small signal levels of interest. Furthermore, even if the bias generator 19 is made temperature independent such that the biasing voltage output is temperature independent, the temperature dependence of transistors Q1 and Q2 and in particular the base-emitter voltage to collector current relationship of these two transistors can result in dramatic changes (a factor of hundreds over a range of 50° C.) in the collector current with changes in temperature.

Accordingly, an improved bias generator is disclosed in my U.S. Pat. No. 4,329,598 which has a coefficient of temperature which matches the coefficient of temperature of the Vbe/Ic characteristics of the load provided by transistors Q1 and Q2 and which generates an Icirc through Q1 and Q2 which is temperature independent.

Figure 2:
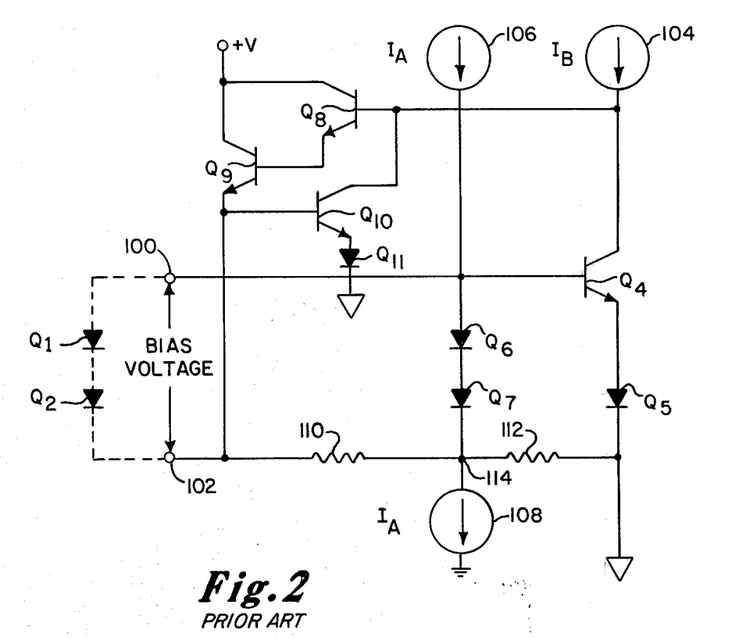
FIG. 2 shows a circuit of a bias generator designed in accordance with the invention described in U.S. Pat. No. 4,329,598.

The bias generator disclosed in my U.S. Pat. No. 4,329,598 and shown in FIG. 2 comprises terminals 100 and 102 for connection with the circuit load, i.e. respectively to base 18 of transistor Q1 and emitter 34 of transistor Q2. For purposes of illustration the base-emitter path of transistor Q1 and the collector-emitter path of transistor Q2 are shown in FIG. 2 in diode form. Terminal 100 is connected to the base of transistor Q4. The collector of transistor Q4 is connected to the current source 104 providing current IB of a fixed amplitude, while the emitter of transistor Q4 is connected to the anode of diode Q5. The cathode of diode Q5 is connected to a low impedance node, such as the output of an operational amplifier, or as shown to system ground. Terminal 100 is also connected to the anode of reference diode Q6, which in turn is connected to both the base of transistor Q4 and the output of current source 106 which provides the current IA at a fixed level. The cathode of diode Q6 is connected to the anode of reference diode Q7, which in turn has its cathode connected to the junction 114 of the two resistors 110 and 112. The opposite side of resistor 110 from junction 114 is connected to terminal 102 while the opposite side of resistor 112 is connected to the cathode of diode Q5 as well as a low impedance node. Junction 114 is also connected to the current source 108 for producing the current IA with the other end of the source being grounded. Source 104 is also connected to a Darlington pair of transistors Q8 and Q9. More specifically, source 104 is connected to the base of transistor Q8 with the emitter of transistor Q8 connected to the base of transistor Q9. The collectors of transistors Q8 and Q9 are tied together to a positive DC voltage source, while the emitter of transistor Q9 is connected to terminal 102 and thus resistor 110. Finally, transistor Q10 has its base connected to the emitter of transistor Q9, its collector connected to the base of transistor Q8 and its emitter connected through diode Q11 the cathode of diode Q5 through the low impedance node. It should be appreciated that in the embodiment shown diodes Q5, Q6 and Q7 are NPN transistors, each connected in the diode mode, i.e., the collector of each transistor is connected to its base. Proper operation of the generator of FIG. 2 depends upon transistors Q4, Q5, Q6 and Q7 having matched Vbe/Ic characteristics with one another as well as transistors Q1, Q2 and Q3 of the operational rectification circuit shown in FIG. 1 and requires that all of the transistors are exposed to the same temperature. This arrangement is easily met with current IC technology. Similarly, transistors Q8, Q9 and Q10 are NPN transistors so that the entire circuit can be formed in accordance with IC techniques.

In operation a different current IB is provided from the source 104 than the current IA provided by each of the sources 106 and 108 so that IB=nIA, where n is an integer or mixed number other than one. With proper selection of the resistor and current source values, substantially all of the current flows from source 104 through transistor Q4 and diode Q5 as a consequence of negative feedback applied to the base of Q5 as will be more evident hereinafter. Similarly, the current drawn from source 106 to the operational rectification circuit is negligible so that substantially all of the current flowing from source 106 flows through the string of reference diodes Q6 and Q7.

As described in my U.S. Pat. No. 4,329,598 the bias voltage generated across terminals 100 and 102 is equal to the voltage drop of diode Q6 plus the voltage drop of diode Q7 minus the voltage drop across the resistor 110. In general, if IB=nIA the voltage across resistor 112 will be that which when subtracted from the voltage across a reference diode string (such as that provided by reference diodes Q6 and Q7) will cause the current through the string to be reduced by a factor of n. The voltage across resistor 110, then, will be that which when subtracted from the voltage across the reference diode string will cause the current through the string to be reduced by a factor of n raised to the kth power. Since the voltage across the output terminals 100 and 102 is the voltage drop across the diode string consisting of diodes Q6 and Q7 minus the voltage drop across resistor 110, and since diodes Q6 and Q7 are matched to transistors Q1 and Q2, the current through the latter string will be a factor of n raised to the kth power less than IA.

For instance, if IA=10 microAmps, IB=50 microAmps, resistor 112=1 kohm, and resistor 110=6 kohms, the value of Icirc will be 640 picoAmps—in this case n=5, k=6 and the Icirc current through transistors Q1 and Q2 will be $5^6$ (15,625) less than 10 microAmps.

The voltage drop across resistor 110 is temperature dependent in accordance with a predetermined temperature coefficient since the voltage is proportional to the current flowing through resistors 110 and 112, which in turn is proportional to the voltage drop across resistor 112. The voltage drop across resistor 112 is equal to the difference in voltage drops across diodes Q6 and Q7 and the voltage drops across transistor Q4 and diode Q5. The voltage differential provided across resistor 112 is linearly related to temperature since the difference in the voltage drop across the pair of diodes Q6 and Q7 and the voltage drop across transistor Q4 and diode Q5 are linearly related to temperature. It should be appreciated that where transistor Q4 and diodes Q6, Q7 and Q5, i.e. diodes Q5, Q6 and Q7 being transistors connected in a diode mode, are matched with transistors Q1 and Q2 for their Vbe/Ic characteristics, and they are always subjected to the same ambient temperature, a change in temperature will modify the bias voltage across terminals 100 and 102 by an amount equal to the change in voltage across diodes Q6 and Q7 minus a change in the voltage drop differential appearing across resistor 110. In this manner the voltage-current temperature dependent function of generator 19 is matched with the voltage-current temperature dependent function of the circuit load. Similarly, Icirc will remain a function of the ratio of resistors 110 and 112, IA and the ratio of IA and IB and will not vary with temperature. Therefore, the change in the biasing voltage with temperature will not effect Icirc which is set at the maximum acceptable level.

Transistors Q8 and Q9 provide the current to resistors 110 and 112 for the necessary voltage drop. In particular, transistors Q8 and Q9 provide negative feedback as well as serve as a buffer between current source 104 and resistors 110 and 112. When current through resistor 112 is insufficient to provide the measured voltage drop, current is diverted from source 104 to the base of transistor Q8 making transistor Q9 sufficiently conductive to provide the necessary current to resistors 110 and 112. Transistor Q10 limits the current drawn from source 104 to the transistors Q8 and Q9 so that a latching situation, which can occur under certain conditions peculiar to the load across terminals 100 and 102 and the form of the low impedance node to which diode Q5 is connected (showed diagramatically in FIG. 2 as ground), can be averted.

Various changes can be made to the generator. For example, the number of reference diodes connected between source 106 and junction 114 and the number between the emitter of transistor Q4 and the low impedance node shown as ground can vary from the respective number shown in FIG. 2. In particular, the number of reference diodes used between source 106 and junction 114 to form one string are equal to the number of semiconductive elements of the load of the circuit applied across terminals 100 and 102. Similarly, the number provided between the emitter of transistor Q4 and the low impedance node shown as ground to form a second string is one less than the number of semiconductive elements of the load of the circuit applied across terminals 100 and 102 since the base emitter of transistor Q4 functions as a reference diode. Additionally the reference diodes in each string are of a like kind and matched to those of the load of the circuit provided across terminals 100 and 102.

Figure 3:
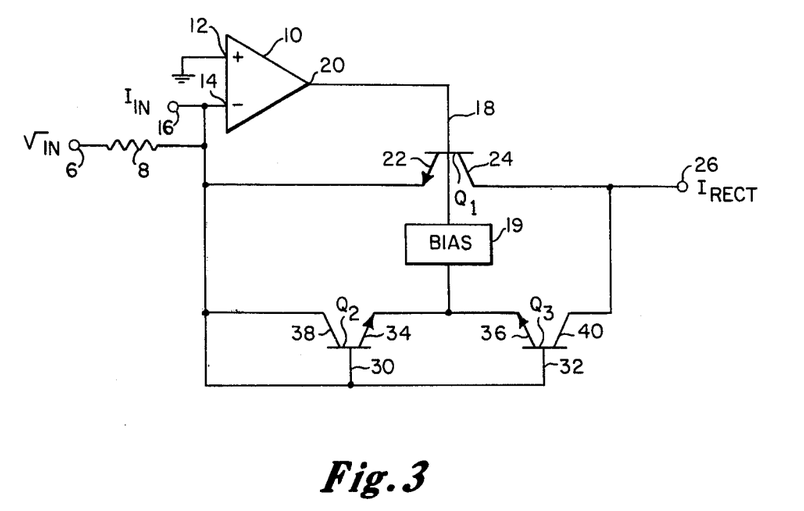
FIG. 3 is a circuit diagram of one embodiment of the current mode operational rectifier of the present invention.
Figure 4:
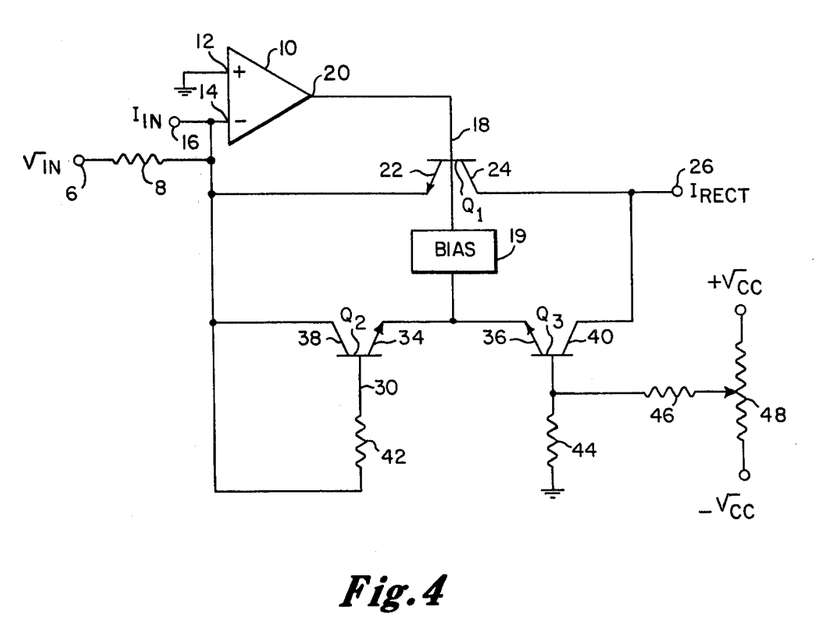
FIG. 4 is a circuit diagram of a second and preferred mode of the current mode operational rectifier of the present invention.
Figure 5:
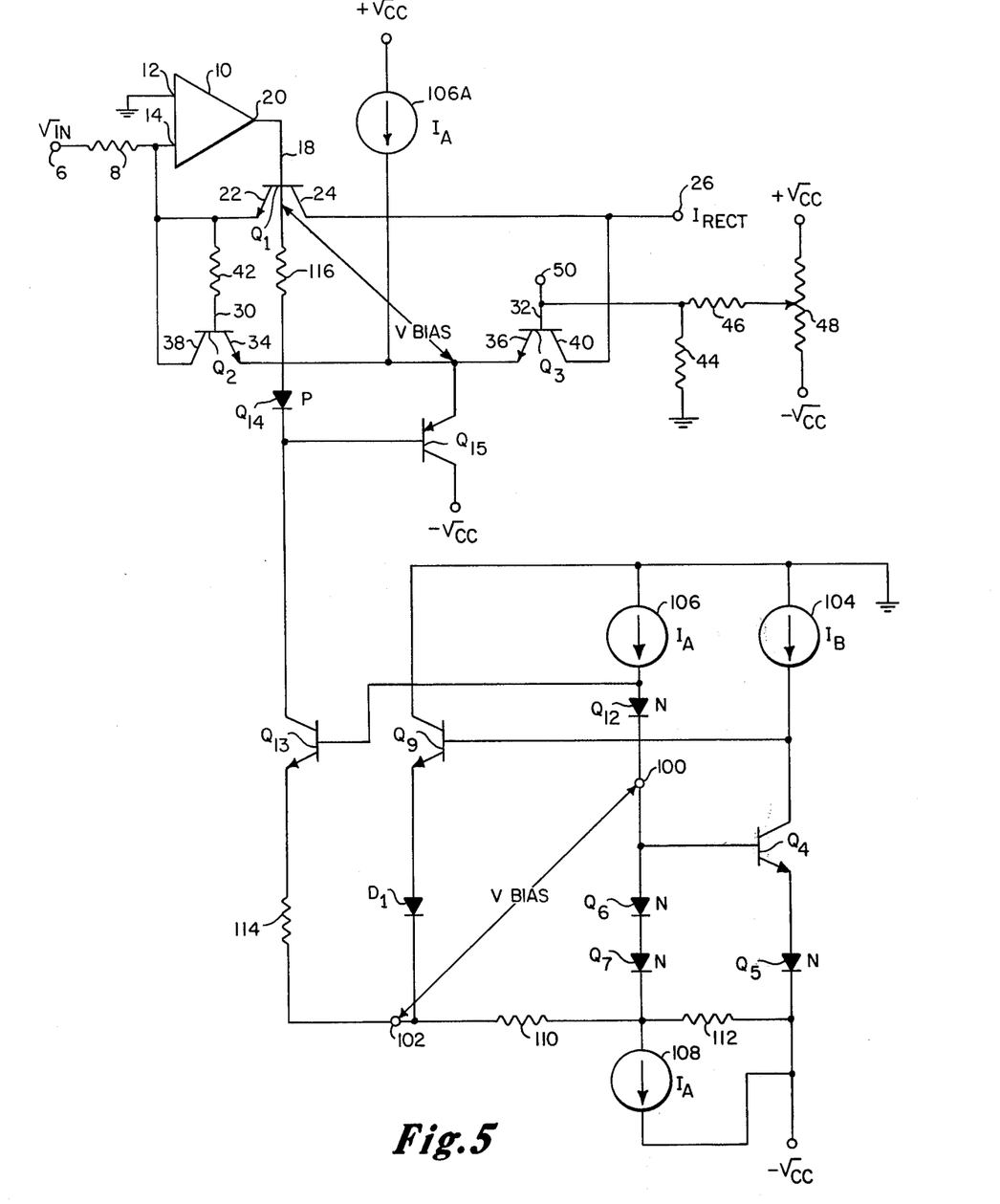
FIG. 5 is a circuit diagram of the preferred embodiment of the bias generator of the present invention for use with the rectifier of FIG. 4.

The circuits shown in FIGS. 1 and 2 have proven to be of substantial value. However, several problems have been encountered. For one, the loop transmission through transistor Q2 of the operational rectifier will increase without limit with increasing current. With regard to the bias generator of FIG. 2, when implementing the circuit into IC form by respectively connecting the terminals 100 and 102 to the base of transistor Q1 and the common emitters of transistors Q2 and Q3 various capacitances to system ground are provided. These capacitances affect the loop transmissions of both the inverting and noninverting paths of the rectifier. Accordingly, the operational rectifier shown in FIG. 1 can be improved as shown in FIGS. 3 and 4, while the bias generator of FIG. 2 can be improved as shown in FIG. 5. These improvements will be more fully understood from the following.

Referring to the operational amplifier described in FIG. 1 for negative input signals at terminals 6 or 16 transistor Q1 is conductive providing feedback. The open loop transmission gain between the negative input of amplifier 10 and input terminal 16 will equal $-A(s)$, wherein $A(s)$ is the transfer function of amplifier 10. This occurs because transistor Q1 functions within the feedback path of the loop as an emitter-follower and therefore provides a maximum of unity feedback. However, for positive input signals at terminals 6 or 16, transistor Q2 is used for feedback conduction. In this situation, the gain in the loop equals the gain of amplifier 10 multiplied by $R_s \cdot g_m$, wherein $R_s$ is the source resistance, i.e. resistor 8, and $g_m$ is the transconductance of transistor Q2 because transistor Q2 is operating as a common base transistor. Therefore, the loop gain equals $-A(s) \cdot R_s \cdot g_m$. However, $g_m$ varies in proportion to the level of the input current. Thus, gain increases with increasing positive input signals with no theoretical limit. This can cause problems since multiplying the gain $-A(s)$ with the gain $R_s \cdot g_m$ can cause too much gain/phase shift, i.e., too much phase shift before unity gain crossover, or too much gain at the 180-phase point of the loop. Accordingly, the FIG. 1 embodiment is modified in accordance with the present invention.

In particular, referring to FIG. 3, transistor Q2 is diode-connected by connecting base 30 to collector 38 so that the transistor operates at unity gain. As a result the gain becomes $(-A(s) \cdot g_m \cdot R_s)/(1 + g_m R_s)$. Thus, as the input current increases the $g_m$ increases and the loop gain limits at $-A(s)$ for arbitrarily large $g_m$. The FIG. 3 embodiment provides no gain symmetry adjustment between transistors Q1 and Q2 and Q3. However, as described in U.S. Pat. No. 4,097,767, in some situations it is desirable to provide a gain symmetry adjustment so as to eliminate the small error otherwise occuring in the rectifier of FIG. 3 between positive and negative swings of the input current at input terminal 16. Accordingly, referring to FIG. 4, the base 30 of transistor Q2 is connected through resistor 42 to its collector, while base 32 of transistor Q3 is connected to the resistive divider formed by resistor 44 having one end connected to system ground and resistor 46 connected to the DC voltage biased potentiometer 48. In order to provide proper gain symmetry for high input currents (i.e., high base currents to transistors Q2 and Q3), resistor 42 should be made approximately equal to resistor 44. Asymmetry between positive and negative swings of input current rectification can be corrected by appropriate adjustment of potentiometer 48.

The operation of the rectifier is further improved by the use of the improved bias generator shown in FIG. 5 connected to the operational rectifier of FIG. 4. In particular, when implementing the circuit of FIG. 2 with the circuit of FIG. 1 in IC form, various capacitances associated with the generator (most importantly, the parasitic collector to substrate capacitances) affect the transmission of current through both the inverting and noninverting paths of the rectifier. The burden that the generator imposes on the loop transmissions of the original rectifier demands that the operational amplifier be slowed down considerably to insure stability.

Accordingly as shown in FIG. 5 the bias generator includes means for generating a bias voltage in a similar manner to that of FIG. 2. However, generally the bias voltage is applied across a first impedance load including first resistive means. The first resistive means is coupled to second resistive means of a second impedance load such that current generated in the first resistive means in response to the bias voltage results in a current being generated in the second resistive means, which in turn provides the bias voltage across the second impedance load. By coupling the second impedance load between the base of transistor Q1 and the common emitters of transistors Q2 and Q3, the bulk of the generator (i.e., the means for generating the bias voltage as well as the first impedance load) can be connected to AC ground.

Referring to the circuit schematic of FIG. 5, the generator is modified from the schematic of FIG. 2. In particular, transistor Q12 has its anode (collector-base) connected to source 106 and its cathode (emitter) connected to the terminal 100 as well as the anode of diode-connected transistor Q6. The source 104 and collector of transistor Q4 are connected directly to the base of NPN transistor Q9, the latter having its collector connected to system ground and its emitter connected to the anode of diode D1. The cathode D1 is connected to resistor 110 and terminal 102. The current source 108, resistor 112 and the cathode of diode connected NPN transistor Q5 are all connected to a negative voltage rail. The anode of diode-connected transistor Q12 is connected to the base of NPN transistor Q13, which in turn has its emitter connected through first resistive means in the form of resistor 114 to terminal 102 and its collector connected to the cathode of a diode-connected PNP transistor Q14 and the base of PNP transistor Q15. The anode of PNP transistor Q14 is connected through resistor 116 to the base 18 of transistor Q1 the junction of base 18 and resistor 116 forming one output terminal of the new bias generator. In the preferred embodiment for reasons which will be more evident hereinafter resistor 114 is of the same value as resistor 116. The transistor Q15 has its collector connected to the negative voltage rail and its emitter (forming the other output terminal of the new bias generator) connected to the common emitters of transistors Q2 and Q3 and to the output of current source 106A. The latter provides an identical current as source 106. For reasons which will be more evident hereinafter the PNP transistors Q14 and Q15 are matched for their $V_{be}/I_c$ transfer characteristics and NPN transistors Q12 and Q13 are matched for their $V_{be}/I_c$ transfer characteristics. Transistor Q8 can be omitted since it has been found that when error signals are generated to the base of transistor Q9, error signals will typically appear to the base of transistor Q4 so that the net effect is cancelled. Transistors Q10 and Q11 can also be omitted since the prior conditions necessitating their use are eliminated. As constructed sources 104, 106 and 108, diode-connected transistors Q5, Q6, Q7, transistor Q4 and resistors 110 and 112 function as means for generating a bias voltage across the terminals 100 and 102 in a similar manner to that of the FIG. 2 circuit. The bias voltage is thus generated across a first "impedance" load comprising diode-connected transistor Q12, the base-emitter junction of transistor Q13 and resistor 114. The bias voltage across this impedance load results in a generated current in the resistor 116. Since resistors 114 and 116 are of equal value and the current through resistor 114 also substantially flows though transistor Q13 and resistor 116, the bias voltage is generated across the second "impedance" load formed by the diode-connected transistor Q14, the base-emitter junction of transistor Q15 and the resistor 116. This second impedance load can be connected between the base of transistor Q1 and the common emitters of transistors Q2 and Q3 so that the bias voltage is impressed therebetween.

More particularly, in operation the voltage signal generated across terminals 100 and 102 equals the desired bias voltage, as described in the copending application. The voltage generated across terminals 100 and 102 appears across the base-emitter junction of transistors Q12 and Q13 and resistor 114. The base-emitter junction of transistor Q13 is forward biased so as to be conductive. The voltage generated across resistor 114 therefore produces a current through the resistor 114 and transistor Q13 which in turn forces a current through resistor 116 and diode-connected transistor Q14. By matching transistors Q12 and Q13 and matching transistors Q14 and Q15, any mismatching in voltage drop between the voltage drop across transistor Q12 and the voltage drop across transistor Q13 due to a mismatching of currents flowing through the collector-emitter paths of these transistors will be offset by a similar mismatch in voltage drops between transistor Q14 and Q15 due to a duplication in the current mismatching since the biasing current through transistor Q15 equals IA. Thus, the first and second impedance loads are always matched, and the voltage generated across resistor 116 and transistors Q14 and Q15 equals the required bias voltage which varies with temperature in accordance with the same voltage-temperature function provided by the voltage drop of the base-emitter junctions of Q1 and Q2.

In addition the provision of transistor Q15, connected as an emitter follower provides a current gain on the emitters of transistors Q2 and Q3 by the factor of beta (the current gain of transistor Q15) plus 1 so that greater currents can be drawn from the emitters of transistors Q2 and Q3 thereby providing greater current capability through the current mirror provided by the two transistors. The provision of diode D1 provides the necessary voltage drop between the collector of transistor Q9 and the terminal 114 due to the omission of the transistor Q8 of FIG. 2.

It will be appreciated that various advantages are achieved by the present invention. By connecting transistor Q2 in a diode mode as shown in FIGS. 3-5, transmission through each feedback loop of amplifier 10 limits at unity gain thereby eliminating stability problems associated with unlimited loop transmission in the rectification of positive signals of the FIG. 1 embodiment. Further, the use of the bias generator shown in FIG. 5, provides an improvement over the FIG. 2 embodiment particularly for IC implementation by allowing the generator to be connected through resistor 116, the amplifier of the rectifier shown in FIG. 5 will operate faster than otherwise provided by the arrangement of FIG. 2.

Since certain changes may be made to the above apparatus without departing from the scope of the invention herein involved, it is intended that all matter contained in the above description or shown in the accompanying drawing shall be interpreted in an illustrative and not in a limiting sense.

What is claimed is:

1. A device for rectifying an AC current input signal applied at its input terminal and adapted to have its output be a current source, said device comprising, in combination (1) an amplifier stage having an inverting input terminal coupled to the input terminal of said device, and an output terminal, (2) a first transmission path including first current conveying means (a) coupled selectively to provide signal transmission between the input and output terminals of said device and (b) connected so that said selective signal transmission over said first transmission path is controlled by the output signal provided at said output terminal of said amplifier stage, wherein a first current flows between the input and output terminals of the device along said first transmission path only when said input signal is of a first polarity; and (3) a second transmission path including second current conveying means (a) coupled selectively to provide signal transmission between the input and output terminals of said device and (b) connected so that said selective signal transmission over said second transmission path is controlled by the output signal provided at said output terminal of said amplifier stage wherein a second current flows between said input and output terminals of said amplifier stage along said second transmission path and an inverted current substantially equal in magnitude but opposite in polarity to said second current simultaneously flows between the output terminal of said amplifier stage and the output terminal of said device along said second transmission path only when said input signal is of a polarity opposite said first polarity, the improvement wherein:

said first and second current conveying means, each include means for respectively poviding a maximum limit of unity voltage feedback with respect to said amplifier stage.

2. A device according to claim 1, wherein said first current conveying means includes a first transistor having its base coupled to the output terminal of said stage and its emitter and collector coupled between the input and output terminals of said device for conducting said first current from said source to said input terminal of said stage and said second current conveying means includes a second transistor having its emitter and collector coupled between said inverting input terminal and the output terminal of said stage, wherein said first and second transistors are respectively connected to provide a maximum limit of unity current gain on said first and second signals.

3. A device according to claim 2, wherein said second transistor is connected so as to operate in a diode mode.

4. A device according to claim 2, wherein said first and second transistors are NPN transistors and said second transistor has its collector coupled to its base and coupled to said inverting input terminal of said stage.

5. A device according to claim 2, further including a third transistor having its emitter and collector coupled and adapted to conduct said inverted current between the output terminal of said stage and the output terminal of said device.

6. A device according to claim 5, wherein said second transistor is connected in a diode mode, said second and third transistors are matched for their Vbe/Ic transfer characteristics and said third transistor is coupled to said second transistor such that said inverted current is a mirror of said second current.

7. A device according to claim 6, wherein said first, second and third transistors are NPN transistors, the emitter of said second transistor is coupled to the emitter of said third transistor and the base and collector of said second transistor are coupled together.

8. A device according to claim 7, wherein said base of said third transistor is coupled to the base of said second transistor.

9. A device according to claim 5, further including means for providing symmetry of gain between the output provided by said first transmission path and said second transmission path.

10. A device according to claim 9, wherein said means for providing symmetry of gain includes means for varying the base voltages of said second and third transistors relative to one another.

11. A device in accordance with claim 5, further including means for providing a cross-over bias between the base of said first transistor and the emitters of said second and third transistors.

12. A device according to claim 11, wherein said means for providing a cross-over bias includes a first impedance load comprising first resistance means, a second impedance load coupled between the base of said first transistor and the emitters of said second and third transistors and including second resistance means coupled to said first resistive means; and means for generating a voltage across said first impedance load so that a current is generated through said first resistance means in response to said voltage, a current is generated in said second resistive means in response to the current in said first resistive means; and bias voltage is generated across said second impedance load.

13. A device according to claim 12, wherein said means for generating said voltage includes means for defining the amount said bias voltage varies as a function of temperature.

14. A device according to claim 13, wherein said means for providing said bias voltage generates a temperature independent circulating current through the base and emitter of said first transistor and the collector and emitter of said second transistor.

15. A device according to claim 14, wherein said means for providing said bias voltage includes means for establishing the maximum level of said circulating current.

16. A device according to claim 11, wherein said means for providing said cross-over bias voltage generates a temperature independent circulating current through the base-emitter path of said first transistor and the collector-emitter path of said second transistor.

17. A bias generator for providing a bias voltage across a circuit load, said generator comprising:
a first impedance load comprising first resistance means;
a second impedance load coupled to said circuit and including second resistive means coupled to said first resistive means; and
means for generating a voltage across said first impedance load so that a current is generated in said first resistive means, a current is generated in said second resistive means in response to said current in said first resistive means, and a biasing voltage is generated across said second impedance load, said means for generating said voltage across said first impedance load including means for setting the level of said voltage across said first impedance load, said means for setting said level of said voltage across said first impedance load including (a) means for defining a first reference voltage, (b) means for defining a second reference voltage and (c) means for providing a difference voltage in response to a comparison between said first and second reference voltages, said difference voltage being related to the difference in voltage drop across the base-emitter junctions of at least two transistors as a function of the change of temperature at said junctions.

18. A bias generator according to claim 17, wherein said means for setting said level of said first reference voltage further includes means for generating a multiple signal equal to said difference signal multiplied by a constant k, and means for summing said multiple signal with said first reference signal so as to form said first reference voltage.

19. A generator according to claim 18, wherein said means for defining said first reference voltage includes a first source of current IA at a first predetermined level and first semiconductive means for conducting said current IA to define a first voltage drop across the base-emitter junction of at least one semiconductor transistor, and said means for defining said second reference voltage includes a second source of current IB to define a second voltage drop across the base-emitter junction of at least one other semiconductor transistor, and said means for providing said difference voltage includes means for subtracting said first voltage drop from said second voltage drop to define said difference voltage.

20. A generator according to claim 19, wherein said means for subtracting said first and second voltage drops includes a first resistor, and said means for generating said multiplied signal includes a second resistor connected to said first resistor so that current generated through said first resistor is supplied through said second resistor and said constant k is defined by the ratio of said second resistor to said first resistor.

21. A generator according to claim 19, wherein IB=nIA, wherein n is a constant different from one.

22. A generator according to claim 17, wherein said first impedance load furlther includes first and second transistor elements of a like conductivity type and substantially matched for their Vbe/Ic transfer characteristics, and said second impedance load further includes third and fourth transistor elements of a like conductivity type and substantially matched for their Vbe/Ic transfer characteristics, said first and third transistors being connected to conduct a like reference current, said second transistor element and said first resistance means being connected to conduct the current generated in said first resistive means, and said fourth transistor element and said second resistance means being connected to conduct said current generated in said second resistive means.

23. A generator according to claim 22, wherein said first and second resistive means are of the same value of resistance.

* * * * *